United States Patent
Imoto

(10) Patent No.: US 8,611,174 B2
(45) Date of Patent: Dec. 17, 2013

(54) SEMICONDUCTOR MEMORY DEVICE

(75) Inventor: Hiroyuki Imoto, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 149 days.

(21) Appl. No.: 13/279,751

(22) Filed: Oct. 24, 2011

(65) Prior Publication Data

US 2012/0155209 A1 Jun. 21, 2012

(30) Foreign Application Priority Data

Dec. 16, 2010 (JP) ................................. 2010-280798

(51) Int. Cl.
*G11C 8/00* (2006.01)

(52) U.S. Cl.
USPC ............ 365/230.03; 365/230.04; 365/230.06; 365/238.5

(58) Field of Classification Search
USPC ................ 365/230.03, 230.04, 230.06, 238.5
See application file for complete search history.

(56) References Cited

U.S. PATENT DOCUMENTS

| | | | |
|---|---|---|---|
| 6,335,873 B1 | 1/2002 | Kawaguchi et al. | |
| 6,483,139 B1 * | 11/2002 | Arimoto et al. | 257/296 |
| 8,441,884 B2 * | 5/2013 | Sato | 365/230.06 |
| 2001/0019503 A1 * | 9/2001 | Ooishi | 365/191 |
| 2001/0043502 A1 * | 11/2001 | Ooishi | 365/230.03 |

FOREIGN PATENT DOCUMENTS

| | | |
|---|---|---|
| JP | 2000-268560 A | 9/2000 |
| JP | 2008-217916 A | 9/2008 |

* cited by examiner

*Primary Examiner* — Toan Le

(74) *Attorney, Agent, or Firm* — Fujitsu Patent Center

(57) ABSTRACT

A semiconductor memory device is configured to have a first memory cell array having a plurality of blocks (cell arrays corresponded to one I/O bit), each block having a plurality of columns and being corresponding respectively to one of data terminals, wherein the blocks being arranged side by side in the column-wise direction, and a second memory cell array configured similarly to the first memory cell array, and is also configured to assign addresses while classifying the even-number-th memory blocks in the first memory cell array and the odd-number-th memory blocks in the second memory cell array into a first set, whereas the odd-number-th memory blocks in the first memory cell array and the even-number-th memory blocks in the second memory cell array into a second set, so as to output data from every other block in each memory cell array upon being accessed with a certain address.

5 Claims, 8 Drawing Sheets

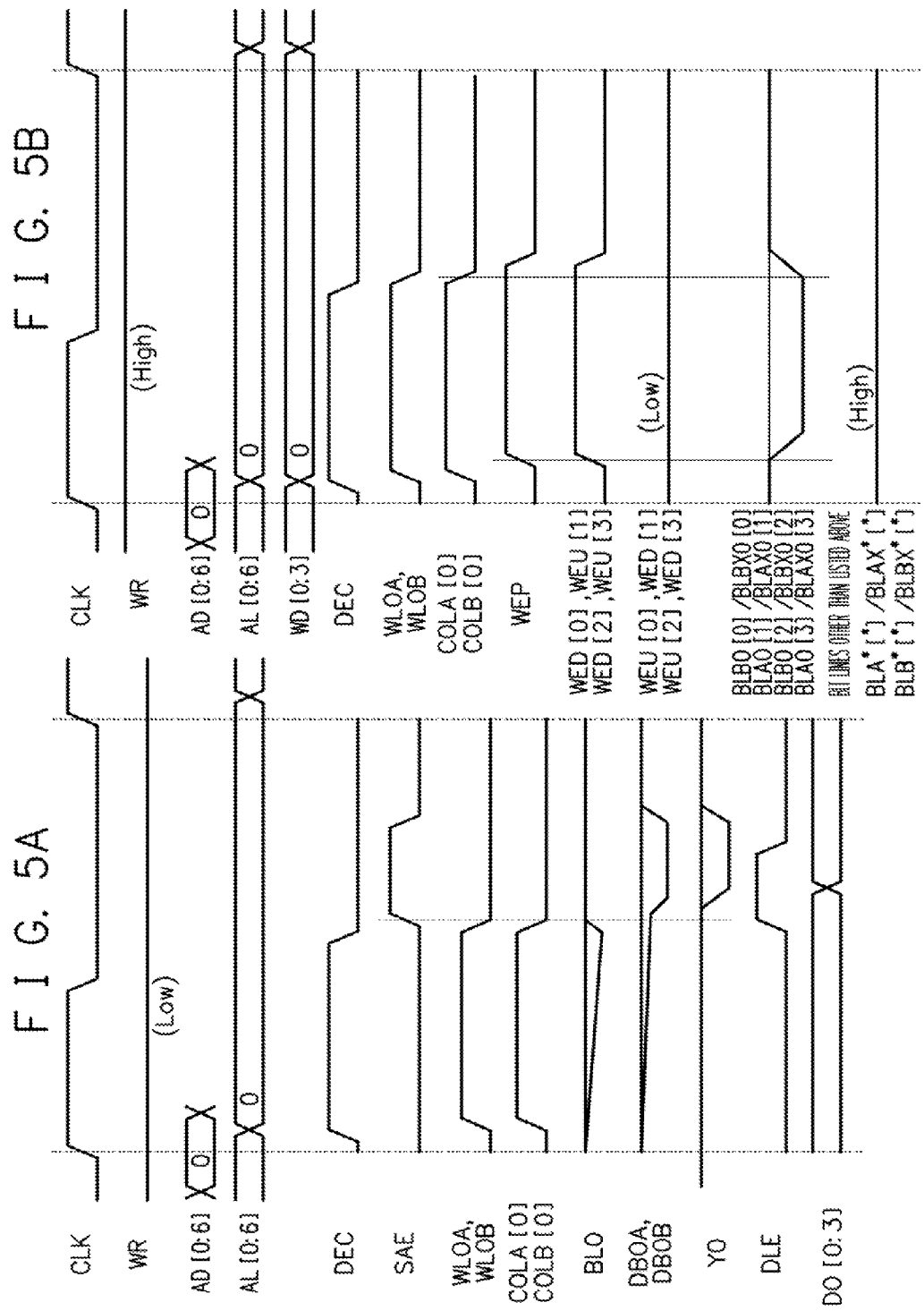

SEMICONDUCTOR MEMORY DEVICE

CROSS-REFERENCE TO RELATED APPLICATION

This application is based upon and claims the benefit of priority of the prior Japanese Patent Application No. 2010-280798, filed on Dec. 16, 2010, the entire contents of which are incorporated herein by reference.

FIELD

The embodiments discussed herein are directed to a technique of suppressing multi-bit error in the semiconductor memory device.

BACKGROUND

Memory cells in semiconductor memory device may cause soft error induced by radioactive ray. Most of the soft errors induced by radioactive ray, in the era of larger design rules, were found in a single bit. However, with recent shrinkage of the design rules, the soft error has become more likely to occur in a plurality of consecutive memory cells by a single shot of radioactive ray (neutron ray is particularly affective).

One general measure against the soft error is to correct errors, by externally adding ECC (Error Correcting Code) to the semiconductor memory device. The error correction is, however, difficult when errors occur at a plurality of data I/O terminals owned by the semiconductor memory device (multi-bit error), since scale of a circuit necessarily added a corrective function will be very large.

A conventional technique of suppressing the multi-bit error ever proposed is such as adopting a column configuration, and bringing physical position of the memory cells, accessible corresponding to the individual data I/O terminals in a single cycle, apart from each other. Other known techniques for DRAM circuit proposed in Japanese Laid-Open Patent Publication Nos. 2000-268560 and 2008-217916, basically adopt physical structures similar to the column structure, so as to bring the physical position of the memory cells, accessible in a single cycle, apart from each other.

For example, in a semiconductor memory device configured to have a four-column structure as illustrated in FIG. 8A, one block is formed by a group of every single COL#0, COL#1, COL#2 and COL#3, and every block is corresponded to each of I/O terminals for data D0 to D2. Correspondent memory cells in the individual blocks are accessed in a single cycle. More specifically, in a single access with a certain address, every fourth memory cell (memory cells in every fourth low) is accessed. Accordingly, even if the soft error due to radioactive ray may occur in hatched cells in FIG. 8A, the error possibly occurs in a single cycle is a one-bit error, and may be coped with the one-bit ECC.

However, in the memory cells of the semiconductor memory device having been shrunk in size under more reduced design rules, the number of memory cells possibly causing the soft error by a single shot of radioactive ray may increase. For example, if the memory cells are shrunk in size as illustrated in FIG. 8B, the semiconductor memory device may cause the soft error in a larger number of memory cells as compared with the example illustrated in FIG. 8A, even under the same four-column configuration. If the soft error due to radioactive ray occurs in the hatched memory cells as illustrated in FIG. 8B, a two-bit error possibly occurs in a single cycle (when accessed by COL#0). Correction of the two-bit error needs a two-bit ECC, but this means a very large scale of additional circuit and makes the error correction difficult.

The two-bit error described in the above may be suppressed by configuring the semiconductor memory device to have, as illustrated in FIG. 8C, the number of columns in a single row exceeding the number of memory cells possibly causing the soft error by a single shot of radioactive ray. FIG. 8C illustrates an exemplary case where an eight-column configuration was adopted while keeping the size of the memory cells in FIG. 8B unchanged. In FIG. 8C, one block is configured by a group of every single COL#0, COL#1, COL#2, COL#3, COL#4, COL#5, COL#6 and COL#7, and every block is corresponded to each of I/O terminals for data D0 to D2. According to the configuration illustrated in FIG. 8C, the error possibly occur in a single cycle of access is a one-bit error, and may be coped with one-bit ECC.

However, a problem described below would arise by the increased number of columns, as exemplified in FIG. 8C. For an exemplary case where a large number of data I/O terminals are required such as in semiconductor memory devices used for high-performance processors, it becomes more difficult to provide a necessary number of data I/O terminals, since the number of data I/O terminals mountable in the same physical size of space in the column-wise direction decreases. An effort of configuring the semiconductor memory device so as to provide the necessary number of data I/O terminals will result in an enlarged circuit area. For example, comparing FIG. 8B with FIG. 8C, the number of data I/O terminals in FIG. 8C in the same physical size of space (lateral width) is found to be half of that in FIG. 8B. If the semiconductor memory device is configured to provide the required number of data I/O terminals as illustrated in FIG. 8C, the lateral width will be doubled from that illustrated in FIG. 8B, thereby the circuit area will increase, and access time will become slower as a consequence.

SUMMARY

According to an aspect of the embodiment, there is provided a semiconductor memory device which includes a first memory cell array having a plurality of memory blocks, each memory block having a plurality of columns and being corresponding respectively to one of a plurality of data terminals, wherein the memory blocks are arranged side by side in the column-wise direction; and a second memory cell array configured similarly as described in the above.

Addresses are assigned by classifying the memory blocks into a first set and a second set, the first set includes the even-number-th memory blocks in the first memory cell array and the odd-number-th memory blocks in the second memory cell array, the second set includes the odd-number-th memory blocks in the first memory cell array and the even-number-th memory blocks in the second memory cell array.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 5A and 5B are drawings illustrating exemplary operations of the semiconductor memory device of the first embodiment;

DESCRIPTION OF EMBODIMENTS

Embodiments will be explained below, referring to the attached drawings.

(First Embodiment)

A first embodiment will be explained.

Figure 1:
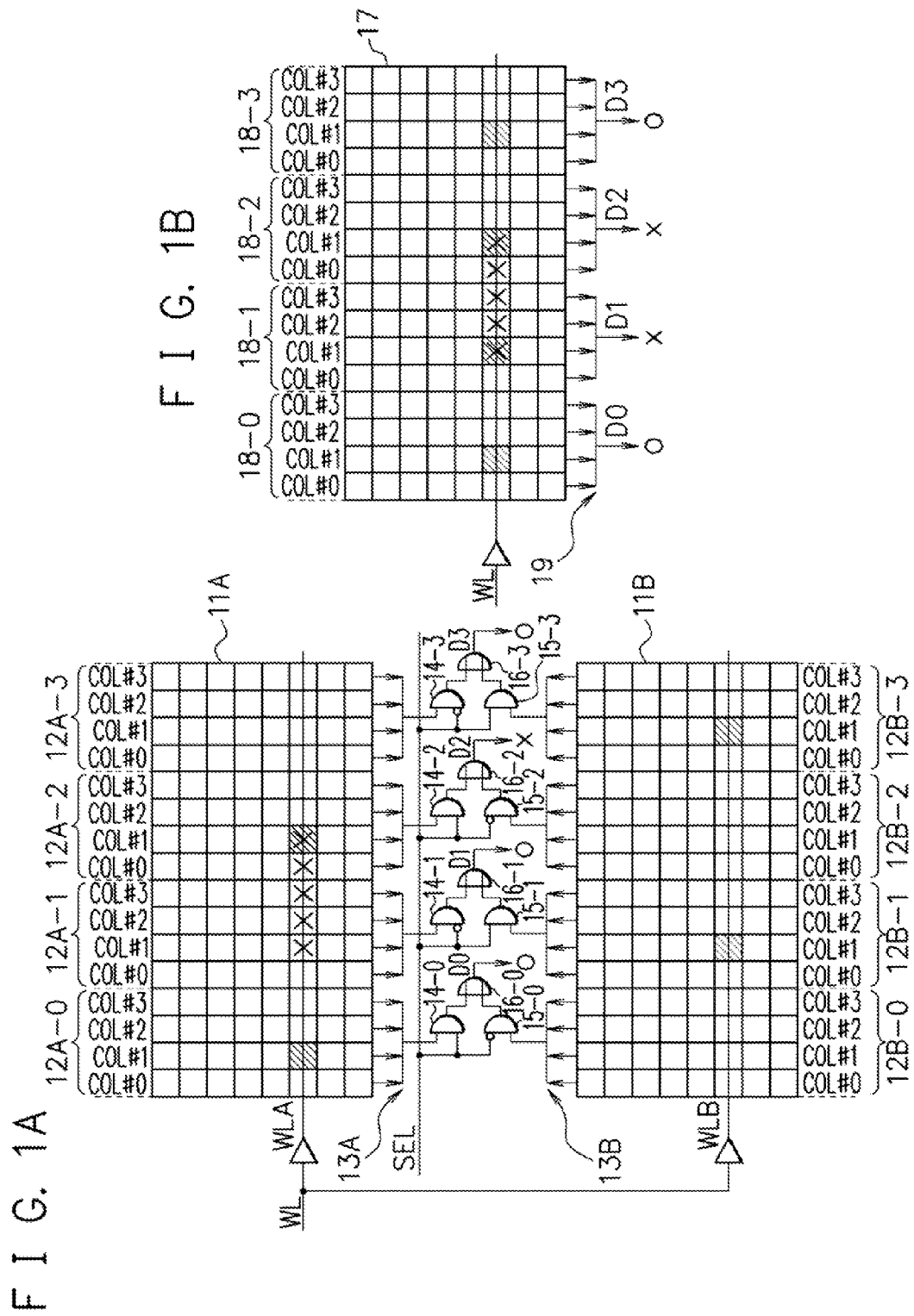
FIG. 1A is a drawing illustrating an exemplary configuration of a semiconductor memory device of a first embodiment.
FIG. 1B is a drawing illustrating an exemplary configuration of a conventional semiconductor memory device.

FIG. 1A is a drawing illustrating an exemplary configuration of the semiconductor memory device of the first embodiment. FIG. 1B is a drawing illustrating an exemplary configuration of a conventional semiconductor memory device. Both of FIG. 1A and FIG. 1B exemplify the semiconductor memory devices having a four-column configuration.

In FIG. 1A, reference numerals 11A, 11B are memory cell arrays each having a plurality of memory cells. In the memory cell array 11A, one block (a cell array corresponded to a single I/O bit) 12A is configured by a group of every single COL#0, COL#1, COL#2 and COL#3 (four columns). Similarly in the memory cell array 11B, one block (a cell array corresponded to a single I/O bit) 12B is configured by a group of every single COL#0, COL#1, COL#2 and COL#3 (four columns). In other words, the memory cell arrays 11A, 11B are configured by blocks 12A-i and 12B-i (i represents a subscript, where i=0, 1, 2, 3) arranged side by side in the column-wise direction. The blocks 12A-i and 12B-i are corresponded to an I/O terminal for the same data Di having the same value of subscript i.

Reference numerals 13A, 13B are column switches, by which one column is selected depending on an address to be accessed. Each of the column switches 13A, 13B outputs the data stored in the memory cell in the column corresponded to the address to be accessed. The semiconductor memory device of this embodiment has logical product operation circuits (AND circuits) 14-i, 15-i, and a logical sum operation circuit (OR circuit) 16-i, for every pair of blocks 12A-i and 12B-i having the same value of subscript i.

The AND circuit 14-i receives an output from the block 12A-i through the column switch 13A, and the AND circuit 15-i receives an output from the block 12B-i through the column switch 13B. Each of the AND circuits 14-0, 14-2, 15-1 and 15-3 receives the selection signal SEL, whereas each of the AND circuits 14-1, 14-3, 15-0 and 15-2 receives the inverted selection signal SEL. The OR circuit 16-i receives an output (operation result) from each of the AND circuits 14-i, 15-i, and outputs the operation result as the data Di through the I/O terminal.

WL represents a word line. A single word line WL is branched into a word line WLA for the memory cell array 11A, and a word line WLB for the memory cell array 11B. Once the word line WL is activated, both word lines WLA and WLB are activated.

In FIG. 1B, reference numeral 17 is memory cell array having a plurality of memory cells. In the memory cell array 17, one block 18 is configured by a group of every single COL#0, COL#1, COL#2 and COL#3, wherein block 18-j is corresponded to an I/O terminal for data Dj having the same value of subscript j (j=0, 1, 2, 3).

Reference numeral 19 is a column switch, by which one column is selected depending on an address to be accessed. The column switch 19 selects the data stored in the memory cell in the column corresponded to the address to be accessed for each block 18-j, and outputs the selected data as the data Dj through the I/O terminal. WL represents a word line.

In the semiconductor memory device of the first embodiment illustrated in FIG. 1A, level of the selection signal SEL is determined depending on the address to be accessed. If the selection signal SEL is a high level ("H"), the output from the blocks 12A-0, 12B-1, 12A-2 and 12B-3 are output as the data D0, D1, D2 and D3. On the other hand, if the selection signal SEL is a low level ("L"), the output from the blocks 12B-0, 12A-1, 12B-2 and 12A-3 are output as the data D0, D1, D2 and D3.

In other words, if the level of selection signal SEL is "H", the blocks 12A-0 and 12A-2 are selected for output in the memory cell array 11A, and the blocks 12B-1 and 12B-3 are selected for output in the memory cell array 11B. On the other hand, if the level of selection signal SEL is "L", the blocks 12A-1 and 12A-3 are selected for output in the memory cell array 11A, and the blocks 12B-0 and 12B-2 are selected for output in memory cell array 11B.

As described in the above, in the semiconductor memory device of the first embodiment illustrated in FIG. 1A, an address is assigned while classifying the blocks 12A-0, 12B-1, 12A-2 and 12B-3 into one set, and another address is assigned while classifying the blocks 12B-0, 12A-1, 12B-2 and 12A-3 into another set. Accordingly, the data in the neighboring blocks are not output upon being accessed in the same cycle, and instead the data in every other block in each of the memory cell arrays 11A, 11B are output. In contrast, in the semiconductor memory device illustrated in FIG. 1B, the data in the blocks 18-0, 18-1, 18-2 and 18-3 are output upon being accessed in the same cycle.

Assuming now that the soft error induced by radioactive ray may occur in the memory cells marked with "×" in FIG. 1A and FIG. 1B, the semiconductor memory device illustrated in FIG. 1B may cause a two-bit error (when accessed by COL#1). In contrast, in the semiconductor memory device of the first embodiment illustrated in FIG. 1A, the blocks 12A-1 and 12A-2 are not accessed in the same cycle for the memory cell array 11A, so that a possible error may be a one-bit error at maximum. As a consequence, according to the first embodiment, the multi-bit error may be suppressed even with a configuration based on a small number of columns, and thereby a semiconductor memory device characterized by readiness of error correction may be provided.

Figure 2:
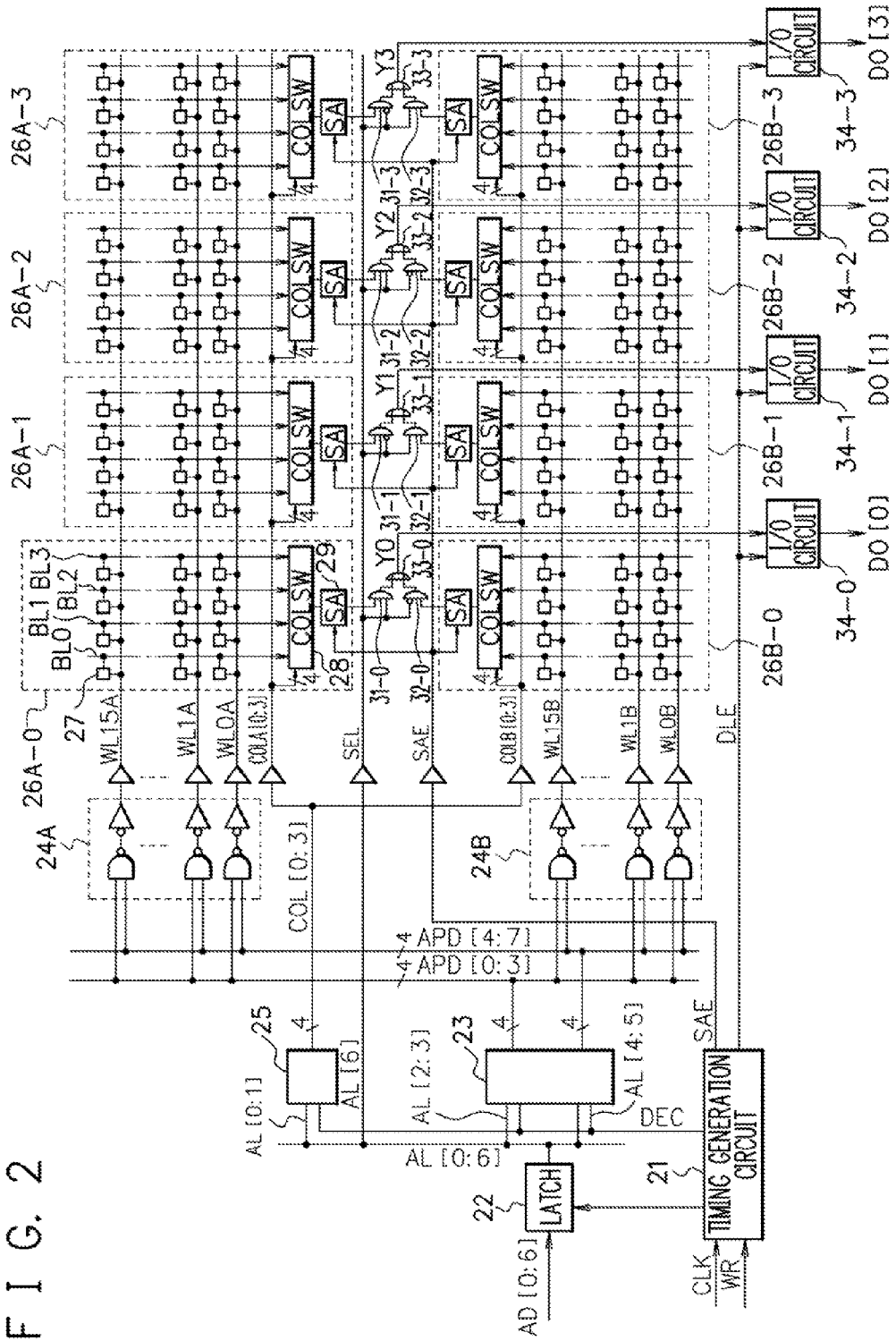
FIG. 2 is a drawing illustrating an exemplary configuration of a semiconductor memory device (readout system) of the first embodiment.
Figure 3:
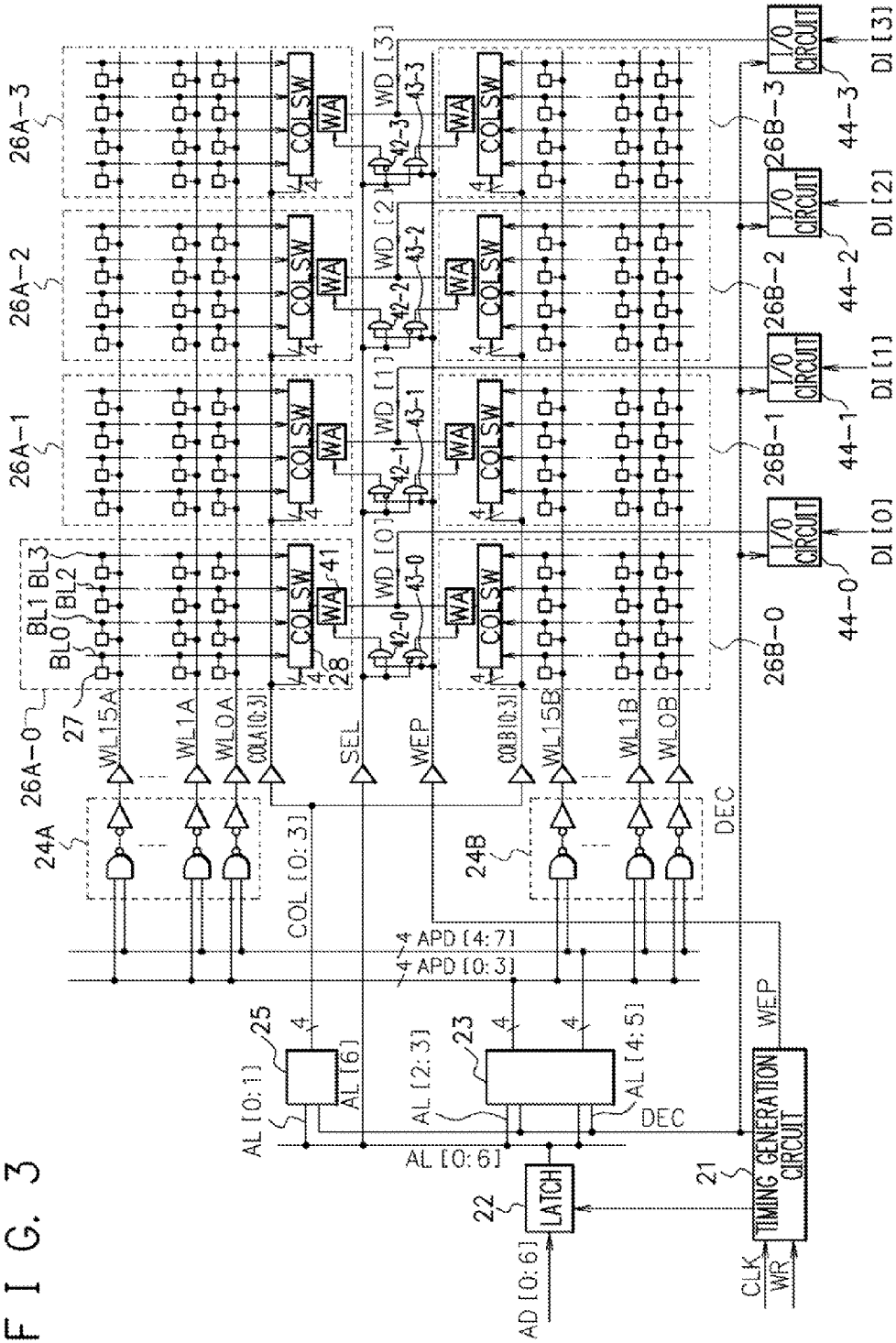
FIG. 3 is a drawing illustrating an exemplary configuration of a semiconductor memory device (write-in system) of the first embodiment.

FIG. 2 and FIG. 3 are drawings illustrating an exemplary configuration of the semiconductor memory device of the first embodiment, embodied as a 128 word×4 bit static memory. FIG. 2 illustrates a configuration of a readout system of the semiconductor memory device, and FIG. 3 illustrates a configuration of a write-in system of the semiconductor memory device.

Referring now to FIG. 2, a timing generation circuit 21 receives a clock signal CLK and a control signal (write/read signal) WR, and generates signals and so forth relevant to the operations of the semiconductor memory device based on the signals CLK, WR, and outputs the generated signals. A latch circuit 22 latches an address signal AD[0:6] which is input according to a latch instruction signal received from the timing generation circuit 21. Note that notation "[X:Y]" of signals is defined to represent a bit string of signal ranging from the X-th bit to the Y-th bit (the same will apply hereinafter). The address signal AD[0:6] herein represents a 7-bit signal indicating an address to be accessed (logical address).

A predecoder 23 receives the latched address signal AL[2:5] from the latch circuit 22, and receives a decode signal DEC from the timing generation circuit 21. The predecoder 23 decodes the latched address signal AL[2:3] in response to the decode signal DEC, and selectively activates one of the address predecode lines APD[0:3] depending on the decoding result. The predecoder 23 also decodes the latched address signal AL[4:5] in response to the decode signal DEC, and selectively activates one of the address predecode lines APD[4:7] depending on the decoding result.

Each of main decoders 24A, 24B has a plurality of AND circuits, into which different combinations of one address predecode line APD[0:3] and one address predecode line APD[4:7] are input. The main decoders 24A, 24B decode the address predecode line APD[0:3] and address predecode line APD[4:7]. Depending on the decoding result, the main decoder 24A activates one of the word lines WL0A to WL15A, and the main decoder 24B activates one of the word lines WL0B to WL15B. The word lines WL0A to WL15A, and WL0B to WL15B activated by the main decoders 24A, 24B are corresponded to each other. For example, when the word line WL0A is activated, also the word line WL0B is activated. If the word line WL1A is activated, also the word line WL1B is activated.

A decoder 25 receives the latched address signal AL[0:1] from the latch circuit 22, and receives the decode signal DEC from the timing generation circuit 21. The decoder 25 decodes the latched address signal AL[0:1] in response to the decode signal DEC, and selectively activates one of the column selection lines COL[0:3] depending on the decoding result.

A block 26A-i (i represents a subscript, where i=0, 1, 2, 3, the same will apply hereinafter) is a cell array corresponded to a single I/O bit, respectively having a plurality of memory cells 27, a column switch 28, and a sense amplifier 29. Similarly, a block 26B-i is a cell array corresponded to a single I/O bit, respectively having a plurality of memory cells 27, a column switch 28, and a sense amplifier 29. The blocks 26A-i and 26B-i are corresponded to the I/O terminal for data DO[i] having the same value of subscript i.

In the block 26A-i, each memory cell 27 is provided at each of the intersections of the bit lines BL0 to BL3 and the word lines WL0A to WL15A, and holds a single bit data. The column switch 28 receives the column selection lines COL[0:3] as column selection lines COLA[0:3], and selects one column in response to the column selection lines COLA[0:3]. That is, the column switch 28 selects one bit line out of the bit lines BL0 to BL3, in response to the column selection lines COLA[0:3]. The sense amplifier 29 amplifies, and then outputs, the output from the column switch 28, in response to the sense amplifier enable signal SAE received from the timing generation circuit 21. Note that the block 26B-i may be understood by replacing the word lines WL0A to WL15A and the column selection lines COLA[0:3] in the block 26A-i respectively with the word lines WL0B to WL15B and the column selection lines COLB[0:3], while leaving the internal configuration of the block 26A-i unchanged.

The semiconductor memory device illustrated in FIG. 2 is provided with AND circuits 31-i, 32-i, and an OR circuit 33-i for every pair of the blocks 26A-i and 26B-i having the same value of subscript i, similarly to the semiconductor memory device illustrated in FIG. 1A. The AND circuit 31-i receives an output from the block 26A-i, and the AND circuit 32-i receives an output from the block 26B-i. Each of the AND circuits 31-0, 31-2, 32-1 and 32-3 receives the selection signal SEL, and each of the AND circuits 31-1, 31-3, 32-0 and 32-2 receives the inverted selection signal SEL. The selection signal SEL herein corresponds to the address signal AL[6] latched by the latch circuit 22.

The OR circuit 33-i receives an output (operation result) of each of the AND circuits 31-i, 32-i, and outputs the operation result as an output Yi. The output Yi of the OR circuit 33-i is latched by the input/output circuit (I/O circuit) 34-i, in response to the data latch enable signal DLE received from the timing generation circuit 21, and is output as the data DO[i] through the I/O terminal.

Next, a configuration illustrated in FIG. 3 will be explained. Note that all constituents appeared in FIG. 3 similar to those appeared in FIG. 2 are given the same reference numerals or symbols, and explanation therefor will not be repeated.

As seen in FIG. 3, each of the blocks 26A-i and 26B-i has the plurality of memory cells 27, the column switch 28, and a write amplifier 41. The blocks 26A-i and 26B-i are corresponded to an I/O terminal for the data DI[i] having the same value of subscript i.

The write amplifier 41 of the block 26A-i receives the write data WD[i] from the input/output circuit (I/O circuit) 44-i, and receives the write enable signal WEU[i] from the AND circuit 42-i. The write amplifier 41 of the block 26A-i then outputs the write data WD[i] to the column switch 28, in response to the write enable signal WEU[i].

Similarly, the write amplifier 41 of the block 26B-i receives the write data WD[i] from the I/O circuit 44-i, and receives the write enable signal WED[i] from the AND circuit 43-i. The write amplifier 41 of the block 26B-i outputs the write data WD[i] to the column switch 28, in response to the write enable signal WED[i].

The write data WD[i], which is output from the I/O circuit 44-i, is data received through the I/O terminal for the data DI[i], and latched by the I/O circuit 44-i, in response to the decode signal DEC received from the timing generation circuit 21.

Each of the AND circuits 42-i and 43-i receives the write enable signal WEP from the timing generation circuit 21. Each of the AND circuits 42-0, 42-2, 43-1 and 43-3 receives the selection signal SEL, and each of the AND circuits 42-1, 42-3, 43-0 and 43-2 receives the inverted selection signal SEL. The AND circuit 42-i outputs the operation result as the write enable signal WEU[i] to the write amplifier 41 of the block 26A-i. The AND circuit 43-i outputs the operation result as the write enable signal WED[i] to the write amplifier 41 of the block 26B-i.

Figure 4A:
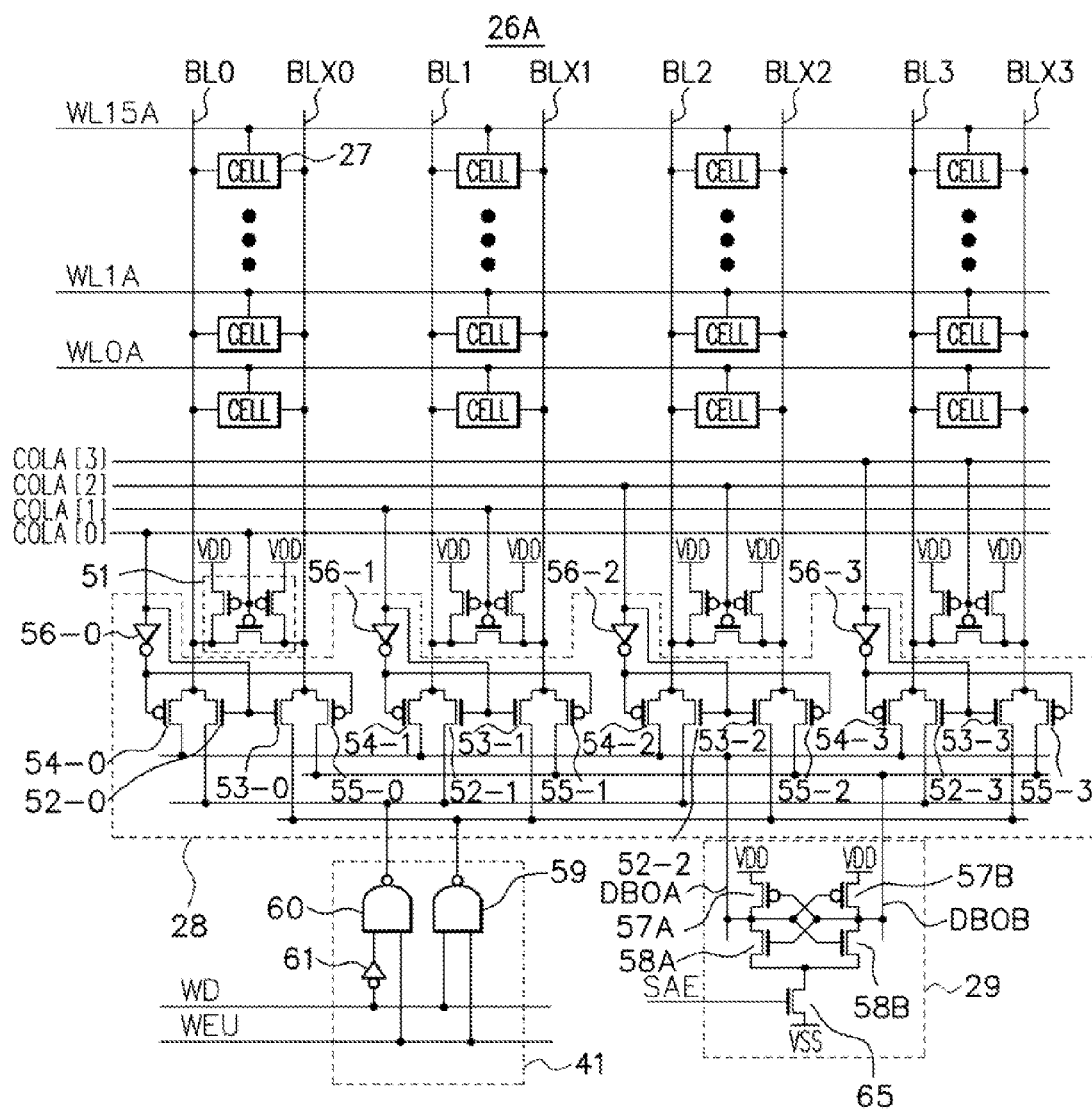
FIG. 4A is a drawing illustrating an exemplary configuration of a cell array corresponded to a single I/O bit.

FIG. 4A is a drawing illustrating an exemplary configuration of a cell array corresponded to a single I/O bit in the semiconductor memory device illustrated in FIG. 2 and FIG. 3. While the description below will be made on the cell array corresponded to a singe I/O bit, referring to FIG. 4A which exemplifies the block 26A, also the block 26B is similarly configured except that the word lines, the column selection lines and the write enable signal are replaced by those corresponded to the block 26B.

Figure 4B:
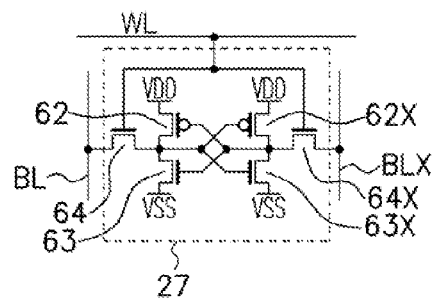
FIG. 4B is a drawing illustrating an exemplary configuration of the memory cell.

As seen in FIG. 4A, each memory cell 27 is connected to the word line WLmA (m represents a subscript, and is an integer of 0 to 15) and the bit lines BLn, BLXn (n represents a subscript, and is an integer of 0 to 3). The bit line BLXn herein is a bit line complementary to the bit line BLn. The memory cell 27 has, typically as illustrated in FIG. 4B, P-channel transistors 62, 62X and N-channel transistors 63, 63X, 64, 64X.

In the memory cell 27, the source of the transistor 62 is connected to the power source potential VDD, the source of the transistor 63 is connected to the reference potential VSS, and the drain of the transistor 62 and the drain of the transistor 63 are connected to each other. Similarly, the source of the transistor 62X is connected to the power source potential VDD, the source of the transistor 63X is connected to the reference potential VSS, and the drain of the transistor 62X and the drain of the transistor 63X are connected to each other. The gates of the transistors 62, 63 are respectively connected to an interconnection point of the drains of the transistors 62X, 63X. The gates of the transistors 62X, 63X are respectively connected to an interconnection point of the drains of the transistors 62, 63.

The interconnection point of the drains of the transistors 62, 63 is connected to the bit line BL, through the transistor 64 having the gate thereof connected to the word line WL. The interconnection point of the drains of the transistors 62X, 63X is connected to the bit line BLX, through the transistor 64X having the gate thereof connected to the word line WL. While FIG. 4B exemplifies a so-called static cell as the memory cell 27, the memory cell 27 may be any arbitrary memory cell causative of soft error, without being limited to that illustrated in FIG. 4B.

A precharge circuit 51 illustrated in FIG. 4A is a circuit which equalizes potential of the bit lines BLn and BLXn, in a period during which the column selection line COLA[n] is not activated. The column switch 28 has N-channel transistors 52-n, 53-n and P-channel transistors 54-n, 55-n, arranged so as to respectively correspond to the bit lines BLn, BLXn, and inverters 56-n.

The sense amplifier 29 has P-channel transistors 57A, 57B, and N-channel transistors 58A, 58B, 65. The sources of the transistors 57A, 57B are connected to the power source potential VDD. The sources of the transistors 58A, 58B are connected to the reference potential VSS, through the transistor 65 having the gate supplied with the sense amplifier enable signal SAE. The drain of the transistor 57A and the drain of the transistor 58A are connected, and the interconnection point thereof and a signal line DBOA are connected to the gates of the transistors 57B, 58B. Similarly, the drain of the transistor 57B and the drain of the transistor 58B are connected, and the interconnection point thereof and a signal line DBOB are connected to the gates of the transistors 57A, 58A. The signal line DBOA is connected to the bit lines BLn through the transistors 54-n in the column switch 28, and the signal line DBOB is connected to the bit lines BLXn through the transistors 55-n in the column switch 28.

The write amplifier 41 has not-logical product operation circuits (NAND circuits) 59, 60 and an inverter 61. The NAND circuit 59 receives the write enable signal WEU output from the AND circuit 42 illustrated in FIG. 3, and the write data WD, and outputs the operation result. The NAND circuit 60 receives the write enable signal WEU output from the AND circuit 42 illustrated in FIG. 3, and the write data WD through the inverter 61, and outputs the operation result.

The output end of the NAND circuit 59 is connected to the bit lines BLXn through the transistors 53-n in the column switch 28, and the output end of the NAND circuit 60 is connected to the bit lines BLn through the transistors 52-n in the column switch 28.

In the column switch 28 herein, the gates of the transistors 52-n, 53-n are connected to the column selection line COLA[n], and the gates of the transistors 54-n, 55-n are connected through the inverters 56-n to the column selection lines COLA[n]. Accordingly, the transistors 52-n, 53-n, 54-n and 55-n of the column switch 28 are turned on when the correspondent column selection line COLA[n] is activated (have a "H" level), and are turned off if not (have a "L" level). In this way, when the column selection line COLA[n] is activated, the correspondent bit lines BLn, BLXn and the sense amplifier 29 are connected through the transistors 54-n and 55-n, and the correspondent bit lines BLn, BLXn and the write amplifier 41 are connected through the transistors 52-n and 53-n.

FIGS. 5A and 5B are drawings illustrating exemplary operations of the semiconductor memory device illustrated in FIG. 2 and FIG. 3. FIG. 5A illustrates waveforms relevant to readout operation (read operation), and FIG. 5B illustrates waveforms relevant to write-in operation (write operation).

As seen in FIG. 5A, upon input of the clock signal CLK while keeping the control signal WR at "L", the semiconductor memory device starts the readout operation. In the semiconductor memory device, an address signal AD[0:6] which indicates an address to be accessed (logical address) is latched and decoded.

Depending on the decoding result of the latched address signal AL[0:5], the word lines WL0A to WL15A, and WL0B to WL15B are selectively activated, and the bit lines BL0 to BL3 are selectively connected to the sense amplifier 29 while being assisted by column selection enabled by the column switch 28. In this way, one memory cell is selected in each of the blocks 26A-i and 26B-i, and data stored therein is amplified and output by the sense amplifier 29.

On the other hand, the latched address signal AL[6] is supplied as the selection signal SEL to the AND circuits 31-i and 32-i, and the data in the AND circuit 31-i received from the block 26A-i or the data in the AND circuit 32-i received from the block 26B-i is output depending on the level of the selection signal SEL. In the example illustrated in FIG. 2, if the selection signal SEL is "H", the data from the blocks 26A-0, 26B-1, 26A-2 and 26B-3 are output through the OR circuits 33-i and the I/O circuits 34-i, finally as the data DO[i] out from the I/O terminals. On the other hand, if the selection signal SEL is "L", the data from the blocks 26B-0, 26A-1, 26B-2 and 26A-3 are output through the OR circuits 33-i and the I/O circuits 34-i, finally as the data DO[i] out from the I/O terminals.

As described in the above, depending on the value of the address signal AD[6] (level of the selection signal SEL), the data are read out from a set of the blocks 26A-0, 26B-1, 26A-2 and 26B-3, or from a set of the blocks 26B-0, 26A-1, 26B-2 and 26A-3. That is, the data are not output from the neighboring blocks upon being accessed with a certain address, and instead the data are output from every other block in each group of blocks 26A-0 to 26A-3 and group of blocks 26B-0 to 26B-3. Accordingly, the multi-bit error may be suppressed even with a configuration based on a small number of columns, and thereby the semiconductor memory device characterized by readiness of error correction may be provided.

On the other hand, upon input of the clock signal CLK while keeping the control signal WR at "H" as illustrated in FIG. 5B, the semiconductor memory device starts the write-in operation. In the semiconductor memory device, an address signal AD[0:6] which indicates an address to be accessed (logical address) is latched and decoded.

Depending on the decoding result of the latched address signal AL[0:5], the word lines WL0A to WL15A, and WL0B to WL15B are selectively activated, and the bit lines BL0 to BL3 are selectively connected to the write amplifier 41 while being assisted by column selection by the column switch 28. On the other hand, the latched address signal AL[6] is supplied as the selection signal SEL to the AND circuits 42-*i* and 43-*i*, and the write enable signal is output to the write amplifiers 41 of the block 26A-i or the block 26B-i, depending on the level of the selection signal SEL.

In the example illustrated in FIG. 3, if the selection signal SEL is "H", the write enable signal is output to the write amplifiers 41 of the blocks 26A-0, 26B-1, 26A-2 and 26B-3. On the other hand, if the selection signal SEL is "L", the write enable signal is output to the write amplifiers 41 of the blocks 26B-0, 26A-1, 26B-2 and 26A-3. In this way, the data may be written in the memory cells specified by the address, corresponding to selection of the blocks in the readout operation.

(Second Embodiment)

Next, a second embodiment will be explained.

Figure 6:
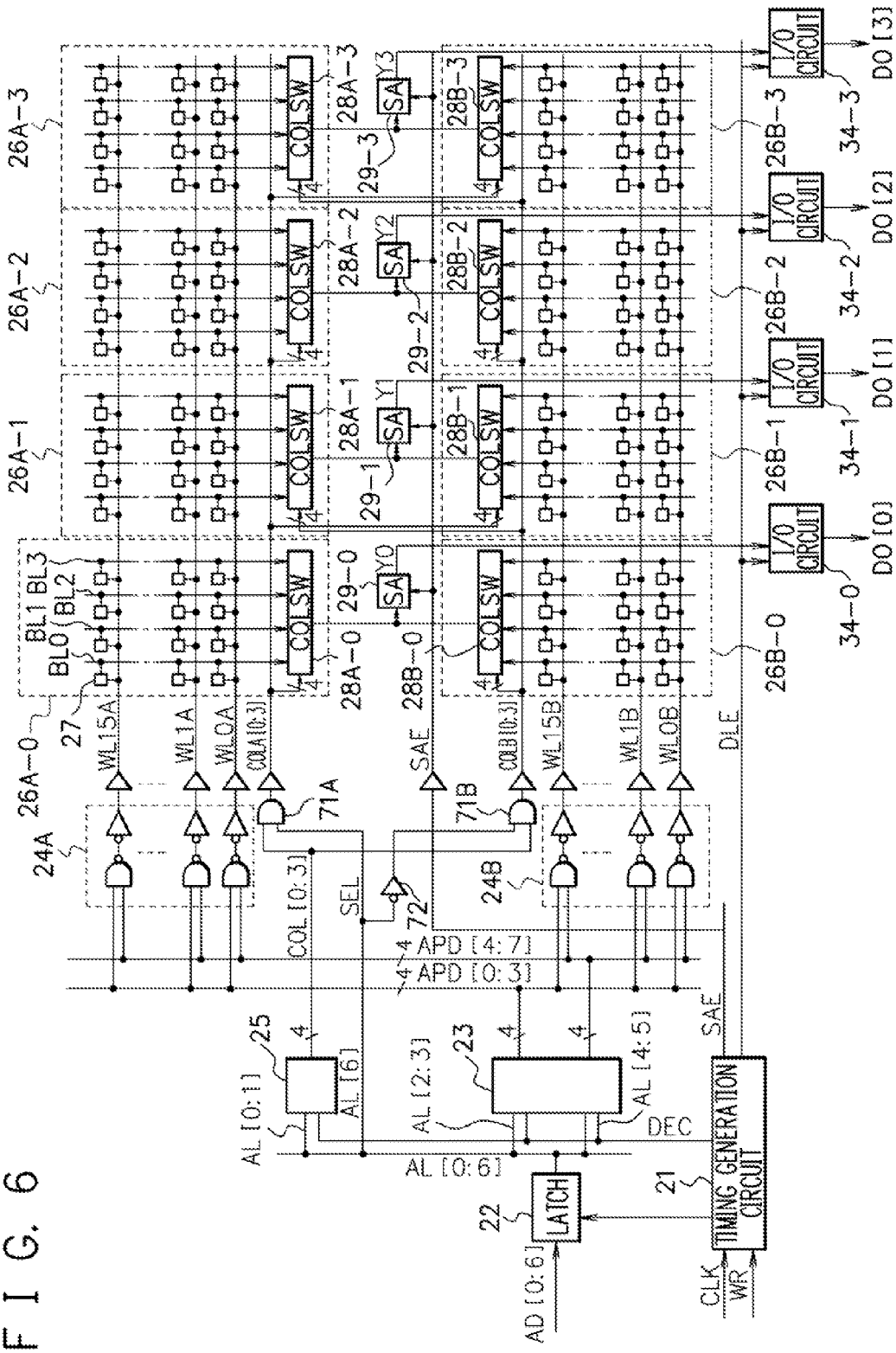
FIG. 6 is a drawing illustrating an exemplary configuration of the semiconductor memory device of a second embodiment.

FIG. 6 is a drawing illustrating an exemplary configuration of the semiconductor memory device of the second embodiment. Note that all constituents appeared in FIG. 6 similar to those appeared in FIG. 2 are given the same reference numerals or symbols, and explanation therefor will not be repeated.

The semiconductor memory device of the second embodiment illustrated in FIG. 6 is configured to incorporate a logic for selecting the blocks 26A-i and 26B-i into the column selection lines COLA[0:3] and COLB[0:3]. The semiconductor memory device of the first embodiment was configured to supply the column selection lines COL[0:3] as the column selection lines COLA[0:3] and COLB[0:3]. In contrast, in the semiconductor memory device of the second embodiment, the column selection lines COL[0:3] is supplied as the column selection lines COLA[0:3] or COLB[0:3], depending on the level of the selection signal SEL.

In the semiconductor memory device of the second embodiment illustrated in FIG. 6, an AND circuit 71A receives the column selection lines COL[0:3] and the selection signal SEL. The AND circuit 71A subjects each bit of the column selection lines COL[0:3] to AND operation with the selection signal SEL, and outputs the operation result as the column selection lines COLA[0:3]. An AND circuit 71B receives the column selection lines COL[0:3], and the selection signal SEL after being inverted by an inverter 72. The AND circuit 71B subjects each bit of the column selection lines COL[0:3] to AND operation with the inverted selection signal SEL, and outputs the operation result as the column selection lines COLB[0:3].

That is, if the selection signal SEL is "H", the column selection lines COL[0:3] is output as the column selection lines COLA[0:3]. The column selection lines COLB[0:3] in this case is kept inactive, without being modified depending on the column selection lines COL[0:3]. On the other hand, if the selection signal SEL is "L", the column selection lines COL[0:3] is output as the column selection lines COLB[0:3], while keeping the column selection lines COLA[0:3] unchanged irrespective of the column selection lines COL[0:3].

In the second embodiment, the column switches 28A-0, 28B-1, 28A-2 and 28B-3 respectively owned by the blocks 26A-0, 26B-1, 26A-2 and 26B-3 are controlled by the column selection lines COLA[0:3]. The column switches 28B-0, 28A-1, 28B-2 and 28A-3 respectively owned by the blocks 26B-0, 26A-1, 26B-2 and 26A-3 are controlled by the column selection lines COLB[0:3].

According to the semiconductor memory device of the second embodiment, the data are read out from a set of blocks 26A-0, 26B-1, 26A-2 and 26B-3, or a set of blocks 26B-0, 26A-1, 26B-2 and 26A-3, and then output, depending on the address to be accessed. That is, the data are not output from the neighboring blocks upon being accessed with a certain address, and instead the data are output from every other block in each group of blocks 26A-0 to 26A-3 and group of blocks 26B-0 to 26B-3.

Accordingly, the multi-bit error may be suppressed even with a configuration based on a small number of columns, and thereby the semiconductor memory device characterized by readiness of error correction may be provided. In addition, since the data are not output at the same time from the blocks 26A-i and 26B-i having the same value of subscript i, and instead output from either one of them, so that sense amplifier 29-*i* may be shared, and thereby the circuit area and power consumption may be saved.

(Third Embodiment)

Next, a third embodiment will be explained.

Figure 7:
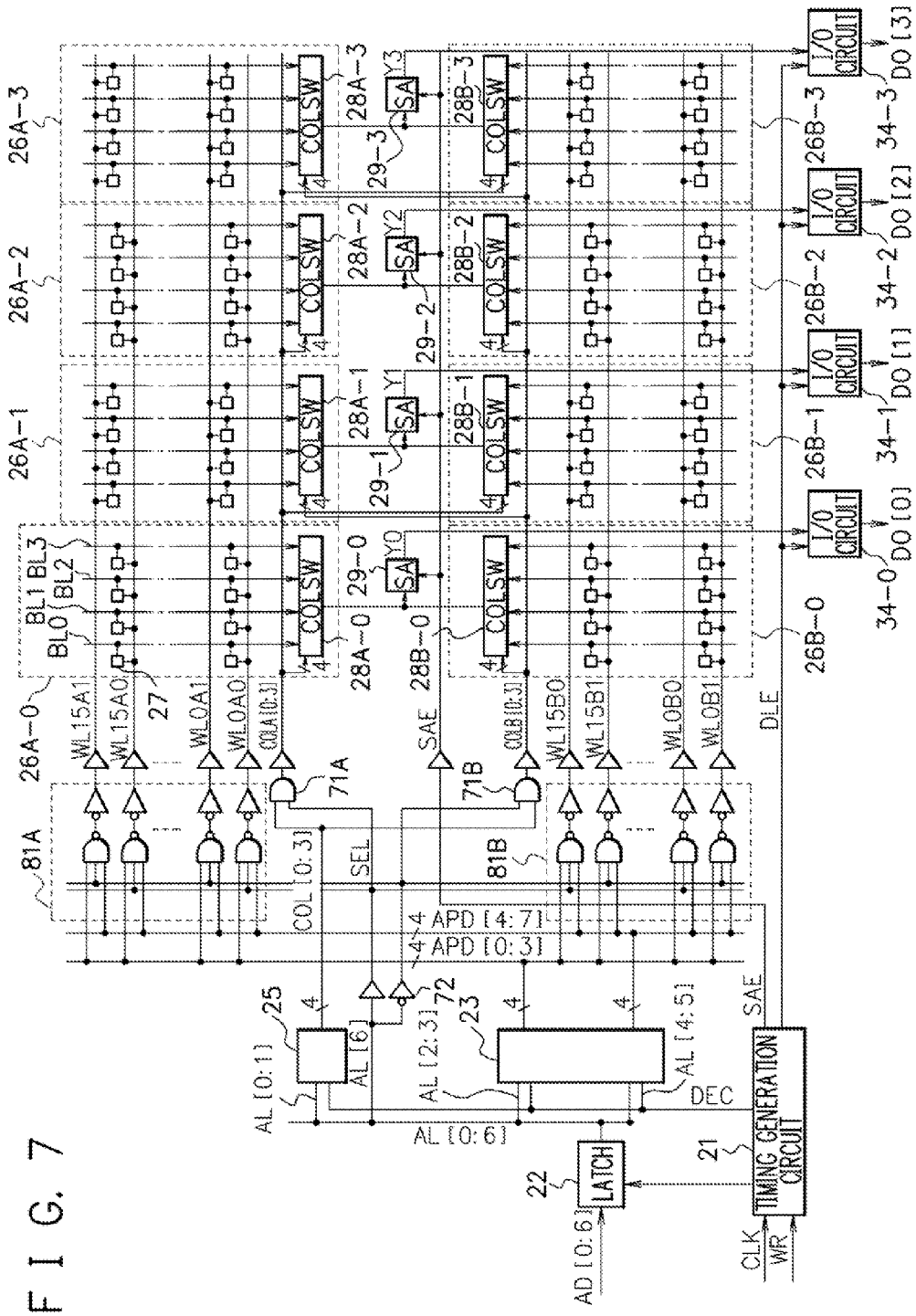
FIG. 7 is a drawing illustrating an exemplary configuration of a semiconductor memory device of a third embodiment.
Figure 8A:
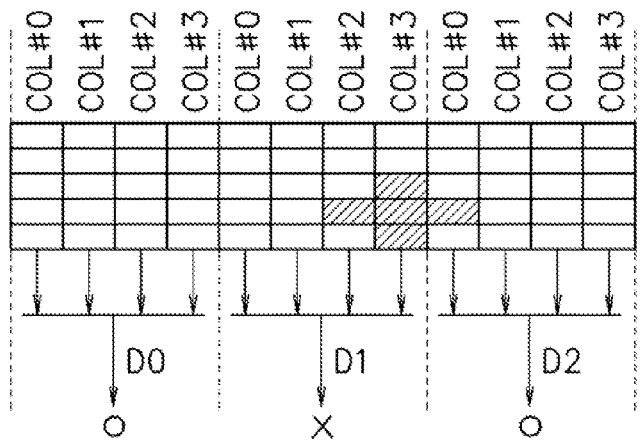
FIGS. 8A to 8C are drawings explaining problems in the semiconductor memory device.
Figure 8B:
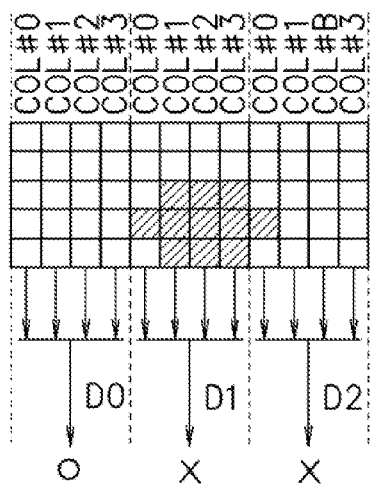
Figure 8C:
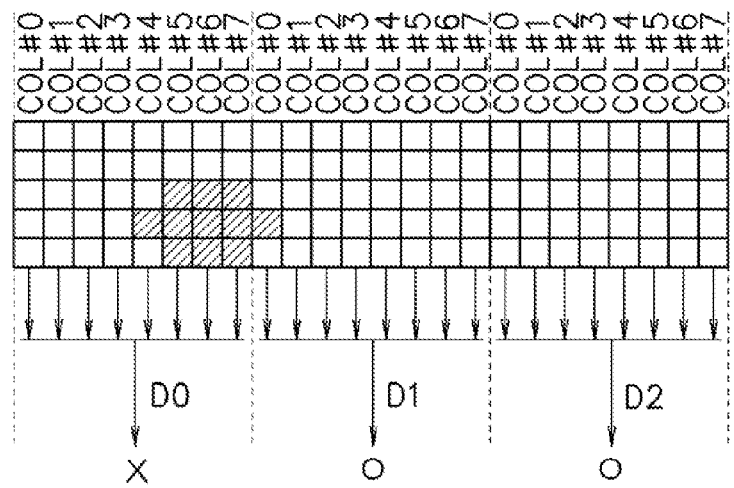

FIG. 7 is a drawing illustrating an exemplary configuration of the semiconductor memory device of the third embodiment. Note that all constituents appeared in FIG. 7 similar to those appeared in FIG. 2 and FIG. 6 are given the same reference numerals or symbols, and explanation therefor will not be repeated.

The semiconductor memory device of the third embodiment illustrated in FIG. 7 has the word lines WL0A to WL15A, and WL0B to WL15B, respectively doubled into word lines WL0A0 to WL15A0 and WL0A1 to WL15A1; and WL0B0 to WL15B0, and WL0B1 to WL15B1. The memory cells 27 owned by the blocks 26A-0 and 26A-2 are connected to the word lines WL0A0 to WL15A0, and the memory cells 27 owned by the blocks 26A-1 and 26A-3 are connected to the word lines WL0A1 to WL15A1. Similarly, the memory cells 27 owned by the blocks 26B-0 and 26B-2 are connected to the word lines WL0B1 to WL15B1, and the memory cells 27 owned by the blocks 26B-1 and 26B-3 are connected to the word lines WL0B0 to WL15B0.

Each of main decoders 81A, 81B decodes the address predecode line APD[0:3] and the address predecode line APD [4:7], and respectively activates one word line, depending on the decoding result and the level of the selection signal SEL. If the selection signal SEL is "H", the main decoder 81A activates one of the word lines WL0A0 to WL15A0, whereas if the selection signal SEL is "L", it activates one of the word lines WL0A1 to WL15A1. On the other hand, if the selection signal SEL is "H", the main decoder 81B activates one of the word lines WL0B1 to WL15B1, whereas if the selection signal SEL is "L", it activates one of the word line WL0B0 to WL15B0. In short, the main decoders 81A and 81B activate only the word lines to which the memory cells of the selected blocks are connected.

While FIG. 7 exemplified a case where the doubled word line configuration was adopted to the semiconductor memory device of the second embodiment, the configuration is also adoptable to the semiconductor memory device of the first embodiment.

According to the third embodiment, not only the effects of the first and second embodiments are obtainable, but also read current in the non-selected block may be reduced, and load of the word lines may be reduced.

In short, according to the semiconductor memory device disclosed herein, the data in the neighboring blocks are not output upon being accessed with a certain address, and instead the data in every other memory block in each of the memory cell arrays 11A, 11B are output. Accordingly, the multi-bit error may be suppressed even with a configuration based on a small number of columns.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory device comprising:
    a first memory cell array having a plurality of memory blocks, each memory block having a plurality of columns and being corresponding respectively to one of a plurality of data terminals, and the memory blocks being arranged side by side in the column-wise direction;
    a second memory cell array having a plurality of memory blocks and a plurality of data terminals of which arrangement is same as the first memory cell array; and
    an output circuit which selectively outputs data received from the memory blocks in a first set, or data received from the memory blocks in a second set, depending on addresses to be accessed,
    wherein the output circuit comprises:
        a first logical product operation circuit which receives the data from the memory blocks in the first set, and receives a selection signal depending on an address to be accessed;
        a second logical product operation circuit which receives the data from the memory blocks in the second set, and receives the inverted selection signal; and
        a logical sum operation circuit which receives an output of the first logical product operation circuit and an output of the second logical product operation circuit, and
    wherein addresses are assigned by classifying the memory blocks into the first set and the second set, the first set including the even-number-th memory blocks in the first memory cell array and the odd-number-th memory blocks in the second memory cell array, and the second set including the odd-number-th memory blocks in the first memory cell array and the even-number-th memory blocks in the second memory cell array.

2. The semiconductor memory device according to claim 1, further comprising:
    a first word line to which the memory blocks in the first set are connected; and
    a second word line to which the memory blocks in the second set are connected,
    the first word line or the second word line being activated depending on the addresses to be accessed.

3. A semiconductor memory device comprising:
    a first memory cell array having a plurality of memory blocks, each memory block having a plurality of columns and being corresponding respectively to one of a plurality of data terminals, and the memory blocks being arranged side by side in the column-wise direction;
    a second memory cell array having a plurality of memory blocks and a plurality of data terminals of which arrangement is same as the first memory cell array; and
    a control circuit which activates a first column selection line for controlling column switches owned by the memory blocks in a first set, or a second column selection line for controlling column switches owned by the memory blocks in a second set, depending on a selection signal corresponded to addresses to be accessed,
    wherein addresses are assigned by classifying the memory blocks into the first set and the second set, the first set including the even-number-th memory blocks in the first memory cell array and the odd-number-th memory blocks in the second memory cell array, and the second set including the odd-number-th memory blocks in the first memory cell array and the even-number-th memory blocks in the second memory cell array,
    wherein each of the memory blocks has a column switch which selects one column from the plurality of columns, and
    the column switches owned by the memory blocks in the first set, or the column switches owned by the memory blocks in the second set, are operated depending on the addresses to be accessed.

4. The semiconductor memory device according to claim 3, wherein the memory block in the first set and the memory block in the second set share a sense amplifier.

5. The semiconductor memory device according to claim 3, further comprising:
    a first word line to which the memory blocks in the first set are connected; and
    a second word line to which the memory blocks in the second set are connected,
    the first word line or the second word line being activated depending on the addresses to be accessed.

* * * * *